(12) United States Patent
An et al.

(10) Patent No.: US 12,581,802 B2
(45) Date of Patent: Mar. 17, 2026

(54) DISPLAY DEVICE AND DRIVING METHOD THEREOF

(71) Applicant: Samsung Display Co., Ltd., Yongin-Si (KR)

(72) Inventors: Tae Hyeong An, Yongin-si (KR); Min Seok Bae, Yongin-si (KR); Jun Woo Son, Yongin-si (KR); Sang Ik Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 735 days.

(21) Appl. No.: 17/882,361

(22) Filed: Aug. 5, 2022

(65) Prior Publication Data

US 2023/0129039 A1 Apr. 27, 2023

(30) Foreign Application Priority Data

Oct. 26, 2021 (KR) ........................ 10-2021-0143967

(51) Int. Cl.
*H10K 59/121* (2023.01)
*G09G 3/3233* (2016.01)
*G09G 3/3266* (2016.01)
*H10K 59/131* (2023.01)

(52) U.S. Cl.
CPC ....... *H10K 59/1213* (2023.02); *G09G 3/3233* (2013.01); *G09G 3/3266* (2013.01); *H10K 59/1216* (2023.02); *H10K 59/131* (2023.02); *G09G 2320/0271* (2013.01)

(58) Field of Classification Search
CPC ............. H10K 59/1213; H10K 59/131; H10K 59/1216; H10K 59/40; G09G 3/3266; G09G 3/3233; G09G 2320/0271; G09G 2320/0295; G09G 2320/041; G09G 2320/0233

See application file for complete search history.

(56) References Cited

U.S. PATENT DOCUMENTS

| | | | |
|---|---|---|---|
| 10,127,857 B2 | 11/2018 | Lee et al. | |
| 2011/0227505 A1* | 9/2011 | Park | H05B 45/60 |
| | | | 315/297 |
| 2015/0154899 A1* | 6/2015 | Chang | G09G 3/3648 |
| | | | 345/55 |
| 2018/0151121 A1* | 5/2018 | Lim | G09G 3/2081 |
| 2019/0385534 A1* | 12/2019 | Park | G09G 3/3275 |

FOREIGN PATENT DOCUMENTS

| | | | |
|---|---|---|---|
| JP | 2021015211 A | * | 2/2021 |
| KR | 1020200046909 A | | 5/2020 |

* cited by examiner

*Primary Examiner* — Stephen G Sherman
(74) *Attorney, Agent, or Firm* — Innovation Counsel LLP

(57) ABSTRACT

A display device includes a pixel and a sensing channel connected to the pixel through a sensing line. The pixel includes: a first transistor including a gate electrode connected to a first node, a first electrode connected to a first power line, and a second electrode connected to a second node; a second transistor including a gate electrode connected to a first scan line, a first electrode connected to a data line, and a second electrode connected to the first node; a third transistor including a gate electrode connected to a second scan line, a first electrode connected to the second node, and a second electrode connected to a third node; and a fourth transistor including a first electrode connected to the first power line and a second electrode connected to the third node. The sensing line is connected to the third node.

16 Claims, 9 Drawing Sheets

DISPLAY DEVICE AND DRIVING METHOD THEREOF

CROSS-REFERENCE TO RELATED APPLICATION

The present application claims priority under 35 U.S.C. § 119(a) to Korean patent application 10-2021-0143967 filed on Oct. 26, 2021 in the Korean Intellectual Property Office, the entire disclosure of which is incorporated herein by reference.

BACKGROUND

1. Technical Field

The present disclosure generally relates to a display device and a driving method thereof.

2. Related Art

With the development of information technologies, the importance of user interface devices, such as a display device, increases. Accordingly, display devices such as a liquid crystal display device and an organic light emitting display device are increasingly used.

Pixels of the display device are degraded as the pixels are used for a long period of time, are used with a high luminance, and are used at a high temperature, and therefore, grayscale correction is required. However, since the number of pixels is very large, temperatures of the pixels are not individually measured, and grayscales are corrected by predicting temperatures in units of blocks, which is general.

Since this temperature prediction is performed through calculation instead of actual measurement, the temperature prediction is inaccurate, and it is difficult to accurately determine a degradation degree of the pixels.

SUMMARY

Embodiments provide a display device capable of determining the temperature of pixels and a driving method of the display device.

In accordance with an aspect of the present disclosure, there is provided a display device including a pixel and a sensing channel connected to the pixel through a sensing line, wherein the pixel includes: a first transistor including a gate electrode connected to a first node, a first electrode connected to a first power line, and a second electrode connected to a second node; a second transistor including a gate electrode connected to a first scan line, a first electrode connected to a data line, and a second electrode connected to the first node; a third transistor including a gate electrode connected to a second scan line, a first electrode connected to the second node, and a second electrode connected to a third node; and a fourth transistor including a first electrode connected to the first power line and a second electrode connected to the third node, and wherein the sensing line is connected to the third node.

The off-current of the fourth transistor changes at a greater rate than the off-current of the third transistor in response to temperature change.

The pixel may include: a storage capacitor including a first electrode connected to the first node and a second electrode connected to the second node; and a light emitting element including an anode connected to the second node and a cathode connected to a second power line.

The first transistor, the second transistor, the third transistor, and the fourth transistor may be N-type transistors.

A gate electrode of the fourth transistor may be connected to the first electrode of the fourth transistor.

A gate electrode of the fourth transistor may be connected to a third scan line.

The sensing channel may include: an initialization voltage switchably connected to the third node; a sensing capacitor including a first electrode connected to the third node; and an analog-digital converter including an input terminal connected to the third node.

During a first period, OFF-level scan signals may be applied to the first scan line, the second scan line, and the third scan line, and the initialization voltage is supplied to the third node. During a second period after the first period, OFF-level scan signals may be applied to the first scan line, the second scan line, and the third scan line, the initialization voltage is disconnected from the third node, and the analog-digital converter may output a digital value corresponding to a voltage of the third node.

A temperature of the pixel may be determined based on a first voltage variation of the third node during the second period.

The degree of temperature change of the pixel may correlate with magnitude of the first voltage variation of the third node during the second period.

During a third period after the second period, OFF-level scan signals may be applied to the first scan line, the second scan line, and the third scan line, and the initialization voltage is supplied to the third node. During a fourth period after the third period, ON-level scan signals may be applied to the first scan line and the second scan line, an OFF-level scan signal may be applied to the third scan line, and the initialization voltage is supplied to the third node. During a fifth period after the fourth period, an ON-level scan signal may be applied to the second scan line, OFF-level scan signals may be applied to the first scan line and the third scan line, the initialization voltage is disconnected from the third node, and the analog-digital converter may output a digital value corresponding to the voltage of the third node.

A reference current of the pixel may be calculated based on the first voltage variation of the third node during the second period and a second voltage variation of the third node during the fifth period.

The reference current may become larger as a difference between the second voltage variation and the first voltage variation becomes larger.

A mobility of the pixel may be determined based on the reference current.

The mobility may become higher as the reference current becomes larger.

In accordance with an aspect of the present disclosure, there is provided a method of driving a display device including a pixel and a sensing channel connected to the pixel through a sensing line, the method including: applying an initialization voltage to the sensing line, in a state in which scan signals having a turn-off level are applied to transistors of the pixel, during a first period; floating the sensing line and measuring a first voltage variation of the sensing line, in a state in which scan signals having the turn-off level are applied to the transistors of the pixel, during a second period after the first period; and calculating a temperature of the pixel, based on the first voltage variation.

The temperature of the pixel may become higher as the first voltage variation becomes larger.

The method may further include: applying the initialization voltage to the sensing line, in a state in which OFF-level scan signals are applied to the transistors of the pixel, during a third period after the second period; writing data in the pixel, during a fourth period after the third period; floating the sensing line and measuring a second voltage variation of the sensing line, during a fifth period after the fourth period; and calculating a reference current of the pixel, based on the first voltage variation and the second voltage variation.

The reference current may become larger as a difference between the second voltage variation and the first voltage variation becomes larger.

A mobility of the pixel may become higher as the reference current becomes larger.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
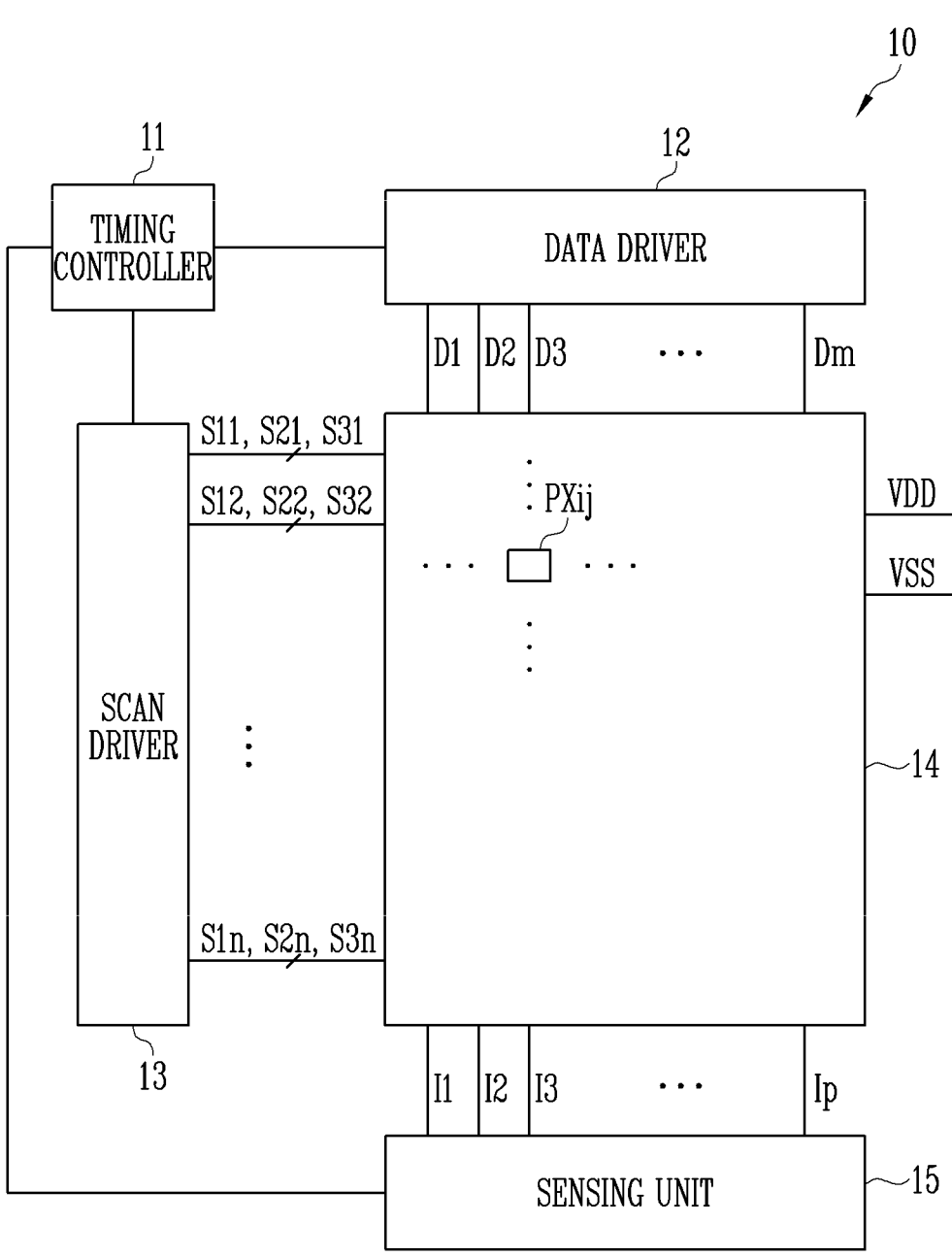
FIG. 1 is a diagram illustrating a display device in accordance with an embodiment of the present disclosure.

Hereinafter, exemplary embodiments are described in detail with reference to the accompanying drawings so that those skilled in the art may easily practice the present disclosure. The present disclosure may be implemented in various different forms and is not limited to the exemplary embodiments described in the present specification.

A part irrelevant to the description will be omitted to clearly describe the present disclosure, and the same or similar constituent elements will be designated by the same reference numerals throughout the specification. Therefore, the same reference numerals may be used in different drawings to identify the same or similar elements.

In addition, the size and thickness of each component illustrated in the drawings are arbitrarily shown for better understanding and ease of description, but the present disclosure is not limited thereto. Thicknesses of several portions and regions are exaggerated for clear expressions.

In description, the expression "equal" may mean "substantially equal." That is, this may mean equality to a degree to which those skilled in the art can understand the equality. Other expressions may be expressions in which "substantially" is omitted.

FIG. 1 is a diagram illustrating a display device in accordance with an embodiment of the present disclosure.

Referring to FIG. 1, the display device 10 in accordance with the embodiment of the present disclosure may include a timing controller 11, a data driver 12, a scan driver 13, a pixel unit 14, and a sensing unit 15.

The timing controller 11 may receive input grayscales for each image frame and control signals from a processor. The timing controller 11 may provide the data driver 12 with compensation grayscales obtained by compensating for the received input grayscales. Also, the timing controller 11 may provide the data driver 12, the scan driver 13, and the sensing unit 15 with control signals suitable for specifications of the data driver 12, the scan driver 13, and the sensing unit 15.

The timing controller 11 may generate compensation grayscales obtained by compensating for input grayscales, corresponding to degradation degrees of pixels. In an embodiment, the timing controller 11 may generate a compensation grayscale obtained by increasing an input grayscale as a pixel PXij is degraded, so that a luminance deviation according to a degradation deviation between pixels can be decreased. In another embodiment, the timing controller 11 may generate a compensation grayscale equal to an input grayscale with respect to a pixel having a high degradation degree, and generate a compensation grayscale by decreasing input grayscales with respect to pixels having a low degradation degree, so that a luminance deviation according to a degradation deviation between pixels can be decreased. Meanwhile, the timing controller 11 may determine the degradation degree of the pixel PXij to become higher as a temperature of the pixel PXij becomes higher.

Meanwhile, the timing controller 11 may generate compensation grayscales obtained by compensating for input grayscales, corresponding to reference currents of pixels. The timing controller 11 may calculate a mobility of the pixel PXij, based on a reference current. For example, the timing controller 11 may calculate a mobility of the pixel PXij to become higher as the reference current becomes larger. In some embodiments, with respect to the same input grayscale, the timing controller 11 may calculate a compensation grayscale to become smaller as the mobility of the pixel PXij becomes higher.

In an embodiment, the timing controller 11 may generate a compensation grayscale by considering both the degradation degree and the mobility of the pixel PXij. For example, the timing controller 11 may calculate a final compensation grayscale by applying a first weighted value to a compensation grayscale obtained by considering the degradation degree of the pixel PXij, applying a second weighted value to a compensation grayscale obtained by considering the mobility of the pixel PXij, and then adding up the compensation grayscales.

In a display period, the data driver 12 may generate data voltages to be provided to data lines D1, D2, D3, . . . , and Dm by using compensation grayscales and control signals, which are received from the timing controller 11. For example, the data driver 12 may sample the compensation grayscales by using a clock signal, and apply data voltages corresponding to the compensation grayscales to the data lines D1, D2, D3, . . . , and Dm in units of pixel rows. Here, m may be an integer greater than 0. The pixel rows may mean pixels connected to the same scan line. In a sensing period of a reference current, the data driver 12 may provide data voltages for sensing to the data lines D1, D2, D3, . . . , and Dm.

The scan driver 13 may generate first scan signals to be provided to first scan lines S11, S12, . . . , and S1*n*, second scan signals to be provided to second scan lines S21, S22, . . . , and S2*n*, and third scan signals to be provided to third scan lines S31, S32, . . . , and S3*n* by receiving a clock signal, a scan start signal, and the like from the timing controller 11. Here, n may be an integer greater than 0.

For example, the scan driver 13 may sequentially supply the first scan signals having a turn-on level to the first scan lines S11, S12, . . . , and S1*n*. Also, the scan driver 13 may sequentially supply the second scan signals having the turn-on level to the second scan lines S21, S22, . . . , and S2*n*. Meanwhile, the scan driver 13 may maintain the third scan signals having a turn-off level, which are supplied the third scan lines S31, S32, . . . , and S3*n*.

For example, the scan driver 13 may include a first scan driver connected to the first scan lines S11, S12, . . . , and S1*n* and a second scan driver connected to the second scan lines S21, S22, . . . , and S2*n*. Each of the first scan driver and the second scan driver may include scan stages configured in the form of shift registers. Each of the first scan driver and the second scan driver may generate scan signals in a manner that sequentially transfers the scan start signal in the form of a pulse of the turn-on level to a next scan stage under the control of the clock signal. For example, the scan driver 13 may connect a static voltage source for providing a voltage of the turn-off level to the third scan lines S31, S32, . . . , and S3*n*.

In the display period, the sensing unit 15 may supply an initialization voltage to sensing lines I1, I2, I3, . . . , and Ip. As used herein, sensing line Ik is any one of the sensing lines I1 through Ip.

In a sensing period, the sensing unit 15 may receive sensing voltages from the sensing lines I1 to Ip connected to the pixels. For example, analog-digital converters of the sensing unit 15 may convert the sensing voltages of the sensing lines I1 to Ip into digital values.

The timing controller 11 may calculate a first voltage variation or a second voltage variation by receiving the digital values from the sensing unit 15. For example, the timing controller 11 may calculate a temperature of the pixel PXij, based on the first voltage variation. Meanwhile, the timing controller 11 may calculate a reference current of the pixel PXij, based on the first voltage variation and the second voltage variation. This will be described in detail with reference to FIGS. 7 and 8.

The sensing unit 15 may include sensing channels connected to sensing lines I1, I2, I3, . . . , and Ip. For example, the sensing lines I1, I2, I3, . . . , and Ip and the sensing channels may correspond one-to-one to each other. For example, a number of the sensing lines I1, I2, I3, . . . , and Ip and a number of the sensing channels may be the same. When the number of the sensing lines I1, I2, I3, . . . , and Ip and the number of the sensing channels do not accord with each other, the sensing lines I1, I2, I3, . . . , and Ip and the sensing channels may be connected to each other through a demultiplexer.

The pixel unit 14 includes pixels. Each pixel PXij may be connected to a corresponding data line, a corresponding scan line, and a corresponding sensing line. The pixels may be commonly connected to a first power line VDD and a second power line VSS. For example, a voltage of the first power line VDD may be higher than a voltage of the second power line VSS.

Figure 2:
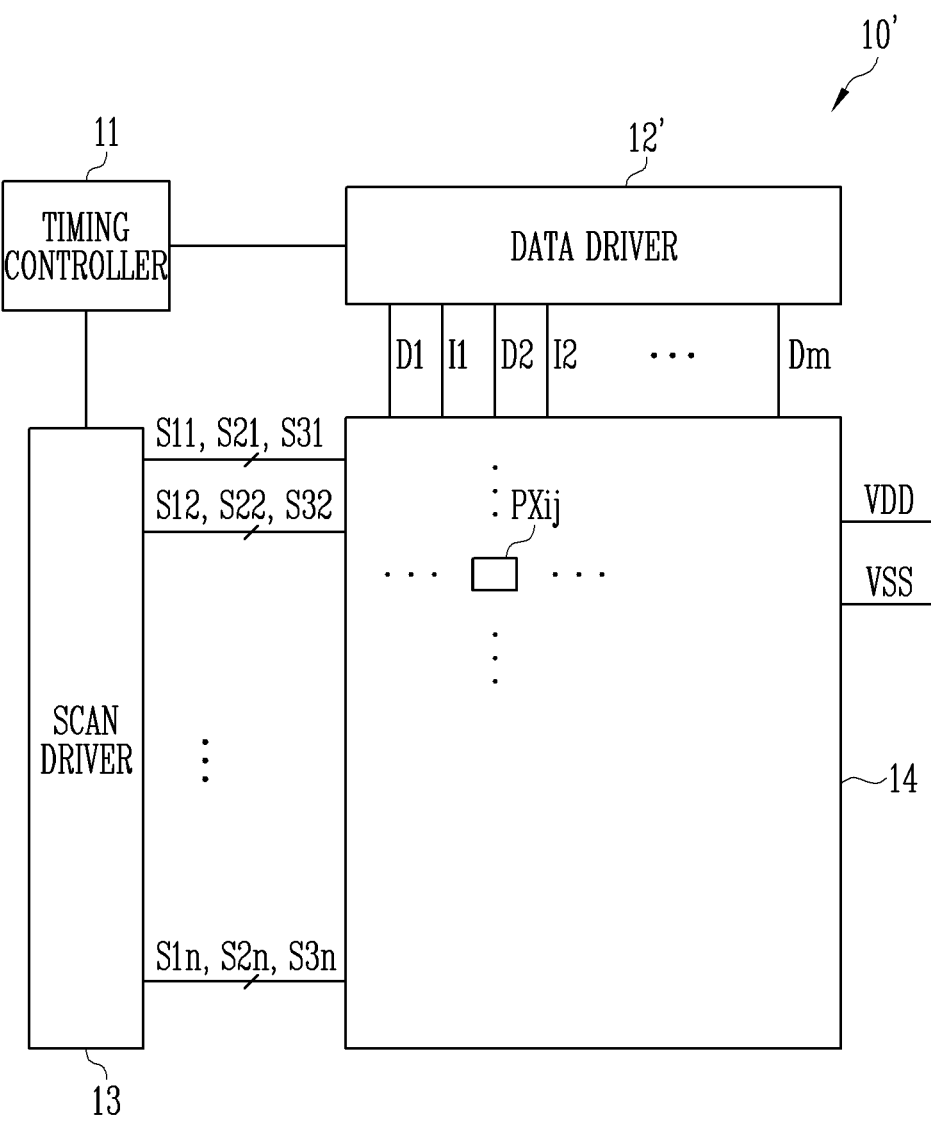
FIG. 2 is a diagram illustrating a display device in accordance with another embodiment of the present disclosure.

FIG. 2 is a diagram illustrating a display device in accordance with another embodiment of the present disclosure.

The display device 10' shown in FIG. 2 may include a timing controller 11, a data driver 12', a scan driver 13, and a pixel unit 14.

The data driver 12' of the display device 10' shown in FIG. 2 may have a configuration in which the data driver 12 and the sensing unit 15 of the display device 10 shown in FIG. 1 are integrated. That is, while the data driver 12 and the sensing unit 15 in the display device 10 shown in FIG. 1 may be configured as integrated circuit (IC) chips separated from each other, the data driver 12' in the display device 10' shown in FIG. 1 may be configured as a single IC chip. Therefore, the data driver 12' may be connected to data lines D1, D2, . . . , and Dm and sensing lines I1, I2, . . . .

Figure 3:
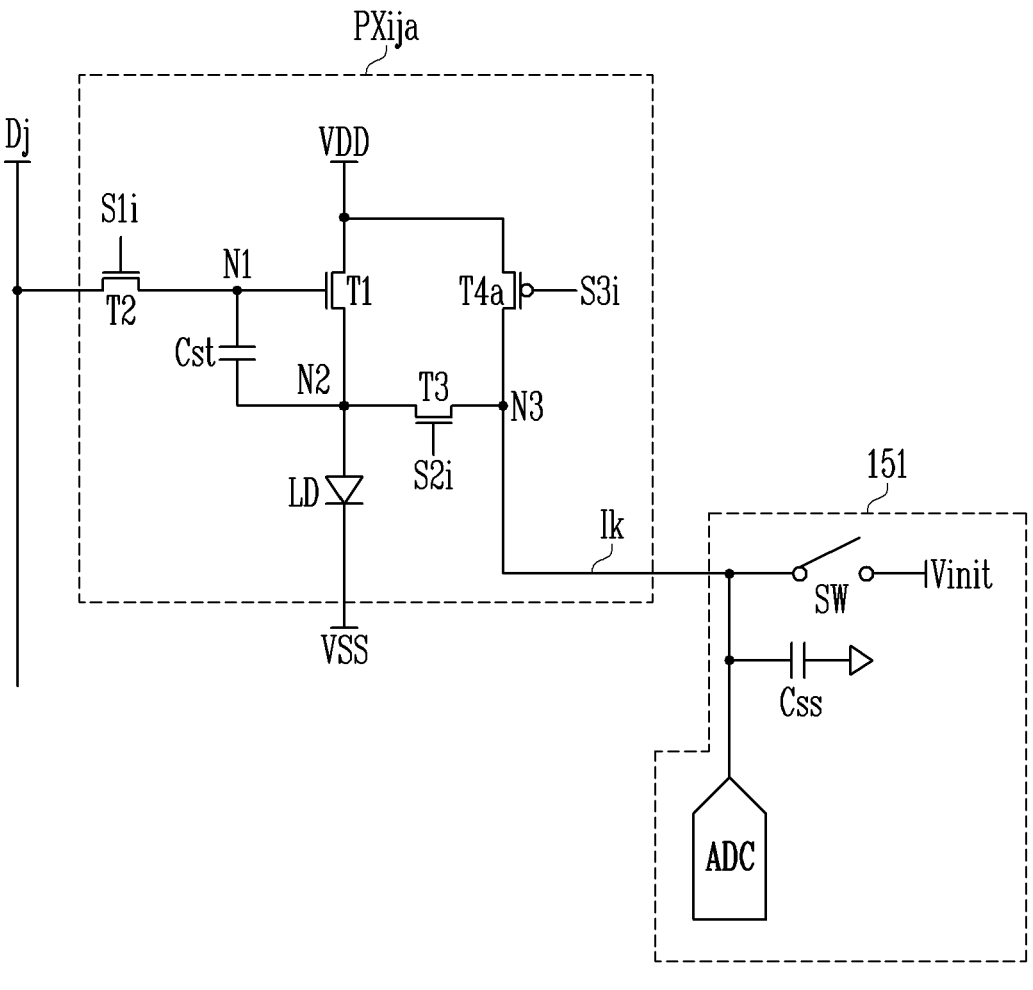
FIG. 3 is a diagram illustrating a pixel in accordance with an embodiment of the present disclosure.

FIG. 3 is a diagram illustrating a pixel in accordance with an embodiment of the present disclosure.

Referring to FIG. 3, the pixel PXija may include first to fourth transistors T1, T2, T3, and T4*a*, a storage capacitor Cst, and a light emitting element LD.

A P-type transistor generally refers to a transistor in which an amount of current flowing increases when a voltage difference between a gate electrode and a source electrode increases in a negative direction. An N-type transistor generally refers to a transistor in which an amount of current flowing increases when a voltage difference between a gate electrode and a source electrode increases in a positive direction. The transistor may be configured in various forms such as a Thin Film Transistor (TFT), a Field Effect Transistor (FET), and a Bipolar Junction Transistor (BIT).

A gate electrode of the first transistor T1 may be connected to a first node N1, a first electrode of the first transistor T1 may be connected to a first power line VDD, and a second electrode of the first transistor T1 may be connected to a second node N2. The first transistor T1 is a driving transistor. The first transistor T1 may be an N-type transistor.

A gate electrode of the second transistor T2 may be connected to a first scan line S1*i*, a first electrode of the second transistor T2 may be connected to a data line Dj, and a second electrode of the second transistor T2 may be connected to the first node N1. The second transistor T2 may be an N-type transistor.

A gate electrode of the third transistor T3 may be connected to a second scan line S2*i*, a first electrode of the third transistor T3 may be connected to the second node N2, and a second electrode of the third transistor T3 may be connected to a third node N3. The third transistor T3 may be an N-type transistor.

A gate electrode of the fourth transistor T4*a* may be connected to a third scan line S3*i*, a first electrode of the fourth transistor T4*a* may be connected to the first power line VDD, and a second electrode of the fourth transistor T4*a* may be connected to the third node N3. The fourth transistor T4*a* may be a P-type transistor.

A first electrode of the storage capacitor Cst may be connected to the first node N1, and a second electrode of the storage capacitor Cst may be connected to the second node N2.

An anode of the light emitting element LD may be connected to the second node N2, and a cathode of the light emitting element LD may be connected to a second power line VSS. The light emitting element LD may be a light emitting diode. The light emitting element LD may be configured as an organic light emitting diode, an inorganic light emitting diode, a quantum dot/well light emitting diode, or the like. In this embodiment, only one light emitting element LD is provided in each pixel. However, in another embodiment, a plurality of light emitting elements may be provided in each pixel. The plurality of light emitting elements may be connected in series, parallel, or series/parallel.

A sensing channel 151 may be connected to the pixel PXija through a sensing line Ik. The sensing line Ik may be connected to the third node N3 of the pixel PXija.

The sensing channel 151 may include a switch SW, a sensing capacitor Css, and an analog-digital converter ADC.

When the switch SW is in an ON state, an initialization voltage Vinit may be supplied to the third node N3. When the switch SW is in an OFF state, the sensing line Ik may be floated. For example, a floating state may mean a state in which a voltage of the sensing line Ik is not fixed since any voltage source is not connected to the sensing line Ik, when the switch SW, the third transistor T3, and the fourth transistor T4 are all in the OFF state.

A first electrode of the sensing capacitor Css may be connected to the third node N3. A second electrode of the sensing capacitor Css may be connected to a ground or a reference voltage source. The sensing capacitor Css may be replaced with a capacitance of the sensing line Ik itself, to be omitted.

An input terminal of the analog-digital converter ADC may be connected to the third node N3. The analog-digital converter ADC may output a digital value corresponding to a voltage of the third node N3.

During a display period, the switch SW may be in the turn-on state, and the third node N3 may maintain the initialization voltage Vinit. When scan signals having a turn-on level (logic high level) are applied to the first scan line S1i and the second scan line S2i, a data voltage for display may be applied to the first node N1 through the data line Dj, and the initialization voltage Vinit may be applied to the second node N2 through the sensing line Ik. The storage capacitor Cst may maintain a voltage difference between the first node N1 and the second node N2. The first transistor T1 may adjust a driving current, based on the voltage difference maintained by the storage capacitor Cst. The light emitting element LD may emit light with a luminance corresponding to an amount of the driving current.

Figure 4:
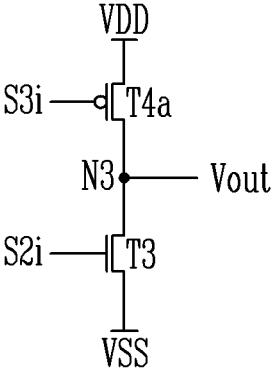
FIGS. 4 to 6 are diagrams illustrating that the pixel shown in FIG. 3 serves as a temperature sensor.
Figure 5:
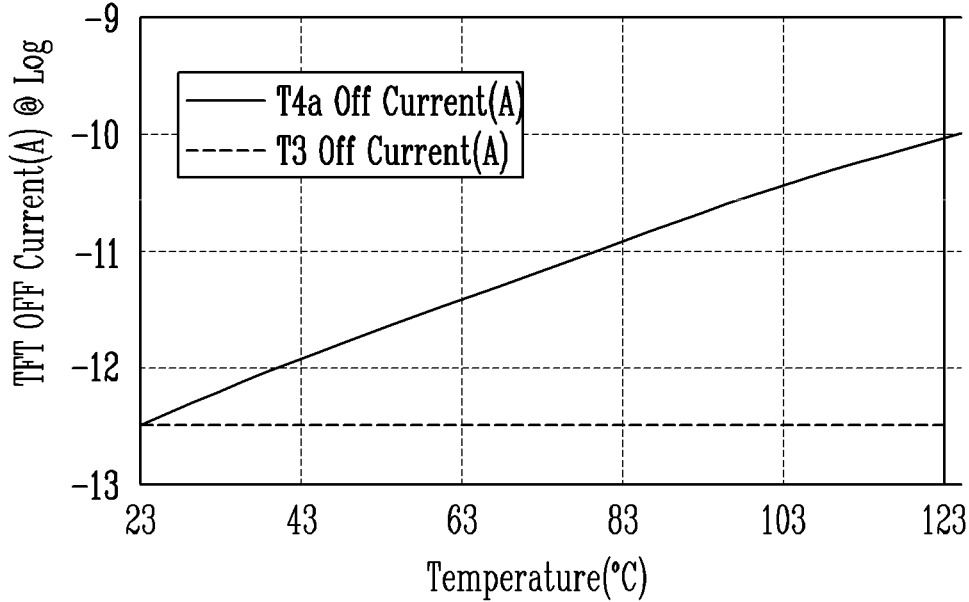
Figure 6:
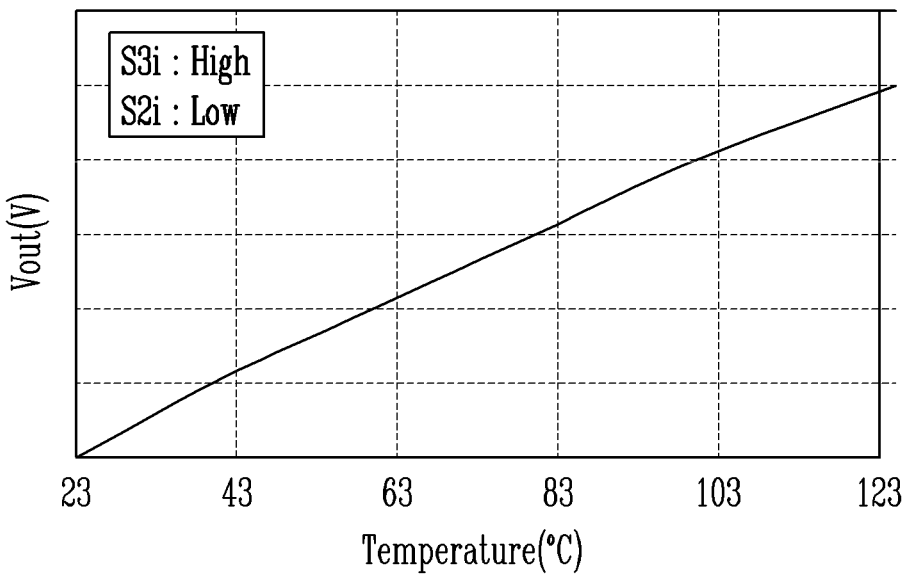

FIGS. 4 to 6 are diagrams illustrating that the pixel shown in FIG. 3 serves as a temperature sensor.

Referring to FIG. 4, the third transistor T3 and the fourth transistor T4a, which are connected in series between the first power line VDD and the second power line VSS, may operate as a temperature sensor. In FIG. 3, the light emitting element LD is located between the second electrode of the third transistor T3 and the second power line VSS, but a voltage applied to both ends of the light emitting element LD can be neglected. A voltage Vout of the third node N3 may correspond to an output voltage of the temperature sensor.

The off-current of a transistor may change with temperature. For example, the off-current of the fourth transistor T4a may increase as the transistor or the pixel as a whole gets warmer. As used herein, "off-current" refers to current flowing between a source electrode and a drain electrode of a transistor while the transistor is turned off. Usually, as the temperature of the transistor rises, more current flows through the transistor in the OFF state. Referring to FIG. 5, the off-current of the fourth transistor T4a increases at a faster rate than the off-current of the third transistor T3. An ideal transistor would have an off-current of 0 A; that is, no current flows through it in the OFF state. However, in this disclosure, the fact that the fourth transistor T4a is not "an ideal transistor" is utilized to make the fourth transistor T4a function as a temperature sensor.

The vertical axis of a graph shown in FIG. 5 represents off-current in an ampere unit in logarithmic scale, and the horizontal axis of the graph represents temperature as linear scale.

Referring to FIG. 6, voltage Vout of the third node N3, based on the off-current of the third transistor T3 and the off-current of the fourth transistor T4a, is illustrated as a function of temperature. As the temperature increases, the off-current of the fourth transistor T4a increases, and therefore, the voltage Vout of the third node N3 may also increase.

The vertical axis of a graph shown in FIG. 6 represents voltage Vout in volts on a linear scale, and the horizontal axis of the graph represents temperature on a linear scale.

Figure 7:
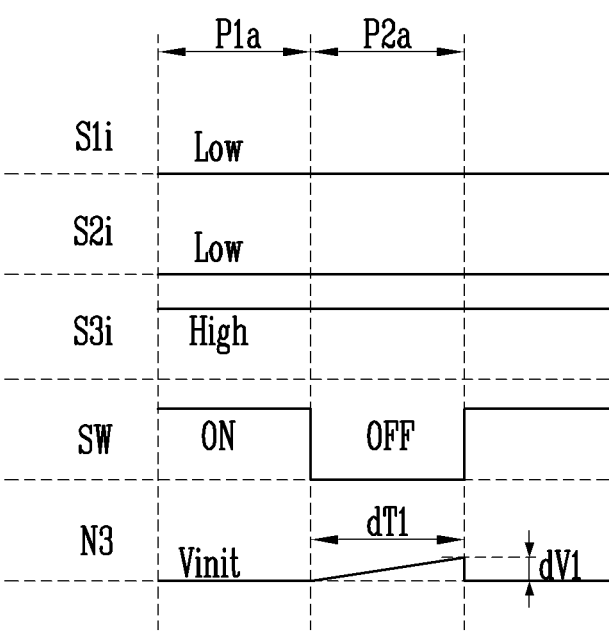
FIG. 7 is a diagram illustrating a method of measuring a temperature of the pixel in accordance with an embodiment of the present disclosure.

FIG. 7 is a diagram illustrating a method of measuring a temperature of the pixel in accordance with an embodiment of the present disclosure. As used herein, an "OFF-level scan signal" refers to a scan signal that turns a transistor OFF, and an "ON-level scan signal" refers to a scan signal that turns a transistor ON.

During a first period P1a, OFF-level scan signals may be applied to the first scan line S1i, the second scan line S2i, and the third scan line S3i. That is, a first scan signal having a logic low level may be applied to the first scan line S1i, a second scan signal having the logic low level may be applied to the second scan line S2i, and a third scan signal having a logic high level may be applied to the third scan line S3i. The switch SW may be in the ON state. Therefore, the third node N3 may be discharged to the initialization voltage Vinit.

During a second period P2a after the first period P1a, the OFF-level scan signals may be applied to the first scan line S1i, the second scan line S2i, and the third scan line S3i. Unlike in the first period P1a, the switch SW may be in the OFF state. Therefore, the third node N3 may be in the floating state. An off-current may flow from the fourth transistor T4a, at a level corresponding to a temperature of the pixel PXija, and the voltage of the third node N3 may increase.

The analog-digital converter ADC may output a digital value corresponding to the voltage of the third node N3. The timing controller 11 may calculate a current of the third node N3 by using the digital value (see Equation 1), and determine a temperature of the pixel PXija from the calculated current (see FIG. 5). An off-current value of the third node N3 and its correlation with the temperature of the fourth transistor T4a shown in FIG. 5, may be pre-stored in a lookup table. The timing controller 11 may calculate the temperature of the pixel PXija, based on a first voltage variation dV1 of the third node N3, during the second period P2a. The temperature of the pixel PXija is assumed to be the same as the temperature of the fourth transistor T4a.

$$Ioff = Csv*(V12-V11)/(T12-T11)$$ [Equation 1]

Ioff may be a current flowing in the sensing line Ik, Csv may be a capacitance of the sensing capacitor Css, T11 may be a first point in time during the second period P2a, T12 may be a second point in time after the first time during the second period P2a, V11 may be a voltage of the third node N3 at the first point in time T11 during the second period P2a, and V12 may be a voltage of the third node N3 at the second point in time T12 during the second period P2a. That is, V12–V11 in Equation 1 may correspond to the first voltage variation dV1 shown in FIG. 7, and T12-T11 in Equation 1 may correspond to a first time interval dT1 shown in FIG. 7. Referring to Equation 1 and FIG. 5, the temperature of the pixel PXija becomes higher as the first voltage variation dV1 of the third node N3 becomes larger during the second period P2a.

Figure 8:
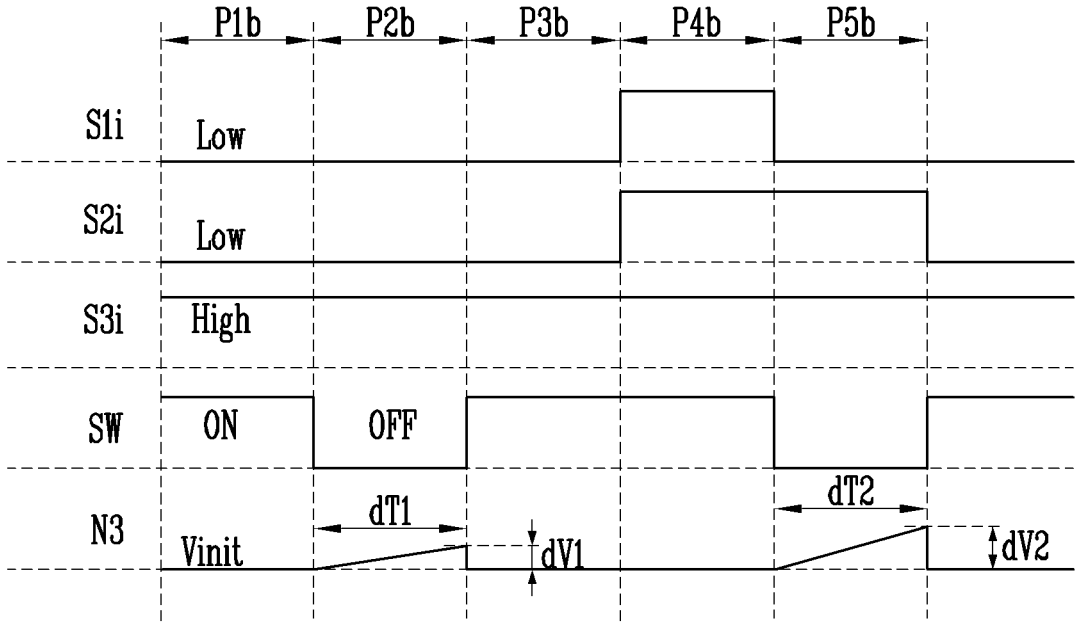
FIG. 8 is a diagram illustrating a method of measuring a reference current of the pixel in accordance with an embodiment of the present disclosure.

FIG. 8 is a diagram illustrating a method of measuring a reference current of the pixel in accordance with an embodiment of the present disclosure.

Calculating of the first voltage variation dV1 through a first period P1b and a second period P2b, which are shown in FIG. 8, is identical to the calculation of the first voltage variation dV1 through the first period P1a and the second period P2a, which are shown in FIG. 7, and therefore, redundant descriptions will be omitted.

During a third period P3b after the second period P2b, OFF-level scan signals may be applied to the first scan line S1i, the second scan line S2i, and the third scan line S3i. The switch SW may be in the ON state. Accordingly, the third node N3 may be discharged (or initialized) to the initialization voltage Vinit.

During a fourth period P4b after the third period P3b, ON-level scan signals (logic high level) may be applied to the first scan line S1i and the second scan line S2i, and an OFF-level scan signal may be applied to the third scan line S3i. The switch SW may be in the ON state.

A data voltage for sensing may be applied to the first node N1 of the pixel PXija through the data line Dj, and the initialization voltage Vinit may be applied to the second node N2 of the pixel PXija through the sensing line Ik. Therefore, a voltage difference between the data voltage for sensing and the initialization voltage Vinit may be stored at the two ends of the storage capacitor Cst. That is, data for sensing may be written in the pixel PXija. The first transistor T1 may be in the turn-on state by the storage capacitor Cst.

During a fifth period P5b after the fourth period P4b, an ON-level scan signal may be applied to the second scan line S2i, and scan OFF-level signals may be applied to the first scan line S1i and the third scan line S3i. The switch SW may be in the OFF state.

As described above, the first transistor T1 is in the ON state, and the third transistor T3 is in the ON state by the second scan signal. Therefore, a reference current corresponding to a mobility of the first transistor T1 may flow into the third node N3. (It is known that the mobility of a transistor may change with temperature.) In addition, an off-current from the fourth transistor T4a may flow into the third node N3, at a level that depends on the temperature of the pixel PXija. Accordingly, a total current value flowing into the third node N3 less the off-current value provides a reference current value.

The analog-digital converter ADC may output a digital value corresponding to the voltage of the third node N3. The timing controller 11 may determine a reference current of the pixel PXija by using the digital value. The timing controller 11 may calculate the reference current of the pixel PXija, based on the first voltage variation of the third node N3 during the second period P2b and a second voltage variation dV2 of the third node N3 during the fifth period P5b.

$$Iref=Csv*((V22-V21)-dV1)/(T22-T21) \qquad \text{[Equation 2]}$$

Iref may be a reference current, Csv may be a capacitance of the sensing capacitor Css, T21 may be a first point in time during the fifth period P5b, T22 may be a second point in time after the first point in time during the fifth period P5b, V21 may be a voltage of the third node N3 at the first point in time T21 during the fifth period P5b, V22 may be a voltage of the third node N3 at the second point in time T22 during the fifth period P5b, and dV1 may be a first voltage variation.

That is, V22–V21 in Equation 2 may correspond to the second voltage variation dV2 shown in FIG. 8, and T22–T21 in Equation 2 may correspond to a second time interval dT2 shown in FIG. 8. The second time interval dT2 may equal to the first time interval dT1. Referring to Equation 2, the reference current becomes larger with a difference between the second voltage variation dV2 and the first voltage variation dV1.

In some embodiments, the timing controller 11 may calculate a mobility of the pixel PXija based on the reference current. For example, the mobility may become higher as the reference current becomes larger.

Figure 9:
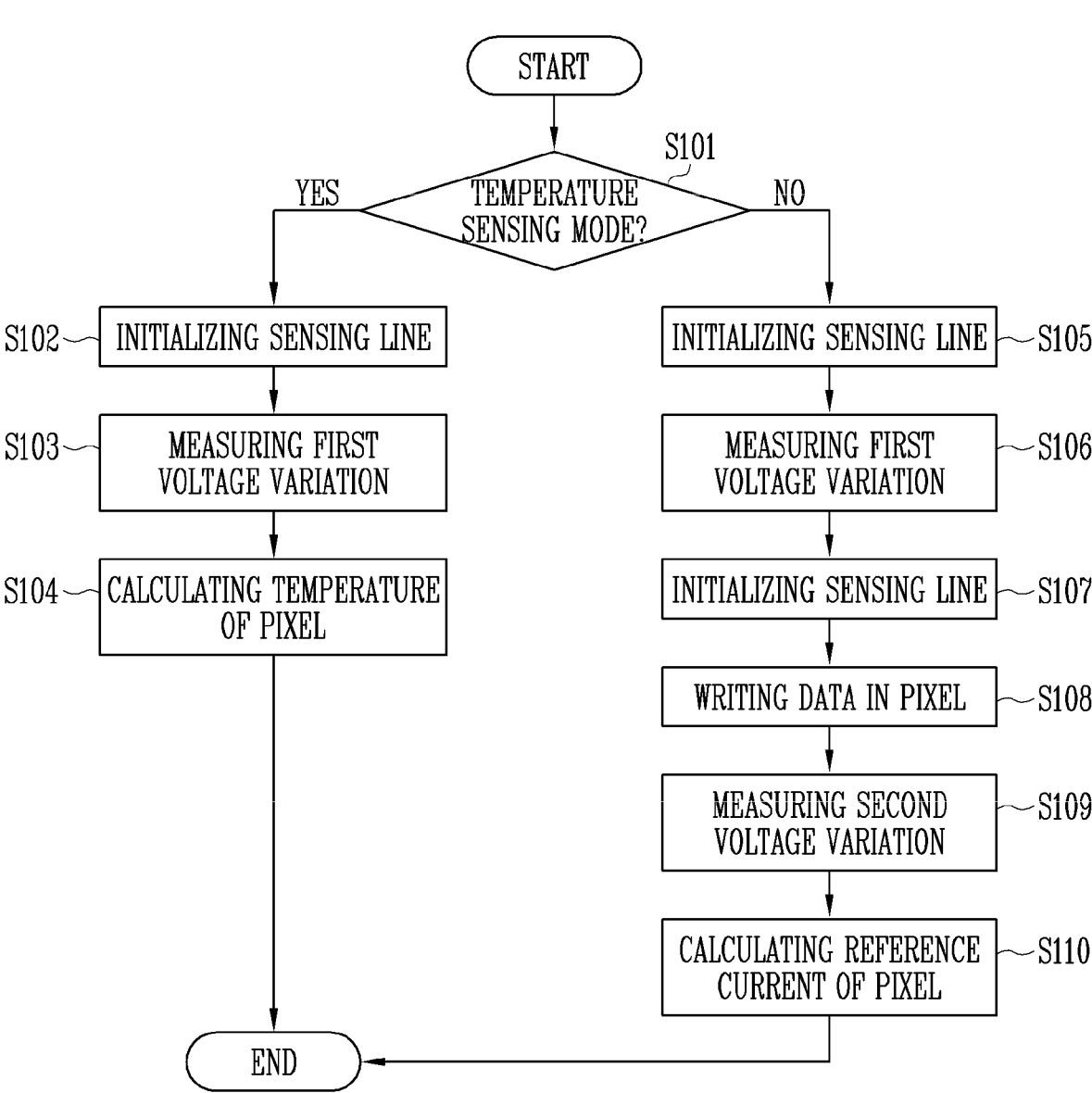
FIG. 9 is a diagram illustrating a driving method of a display device in accordance with an embodiment of the present disclosure.

FIG. 9 is a diagram illustrating a driving method of a display device in accordance with an embodiment of the present disclosure.

First, the display device 10 may determine whether the mode of the display device 10 is a temperature sensing mode (S101). When the mode of the display device 10 is the temperature sensing mode, the display device 10 may perform step S102 of initializing the sensing line Ik, corresponding to the first period P1a shown in FIG. 7. Subsequently, the display device 10 may perform step S103 of measuring a first voltage variation dV1 and step S104 of calculating a temperature of the pixel PXij, corresponding to the second period P2a shown in FIG. 7. As this process has been described above in reference to FIG. 7, any redundant descriptions are omitted.

When the display device 10 is not in the temperature sensing mode but in a reference current sensing mode, the display device 10 may perform step S105 of initializing the sensing line Ik, corresponding to the first period P1b shown in FIG. 8. Subsequently, the display device 10 may perform step S106 of measuring a first voltage variation dV1, corresponding to the second period P2b shown in FIG. 8. Subsequently, the display device 10 may perform step S107 of initializing the sensing line Ik, corresponding to the third period P3b shown in FIG. 8. Next, the display device 10 may perform step S108 of writing data in the pixel PXij, corresponding to the fourth period P4b shown in FIG. 8. Next, the display device 10 may perform step S109 of measuring a second voltage variation dV2 and step S110 of calculating a reference current of the pixel PXij, corresponding to the fifth period P5b shown in FIG. 8. as this process has been described with reference to FIG. 8, any redundant descriptions are omitted.

Figure 10:
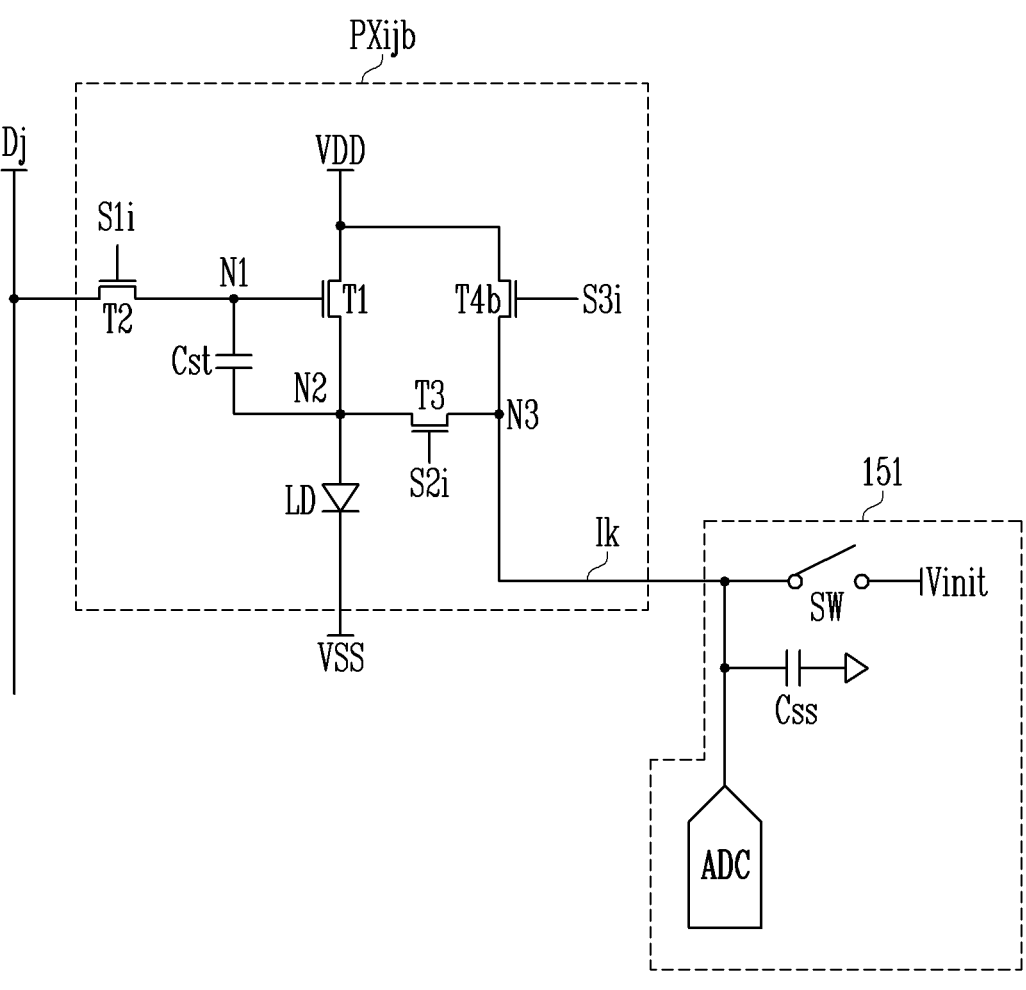
FIG. 10 is a diagram illustrating a pixel in accordance with another embodiment of the present disclosure.

FIG. 10 is a diagram illustrating a pixel in accordance with another embodiment of the present disclosure.

A fourth transistor T4b of the pixel PXijb shown in FIG. is different from the fourth transistor T4a of the pixel PXija shown in FIG. 3, in that the fourth transistor T4b is configured as an N-type transistor. Therefore, a polarity of a third scan signal to be applied to a gate electrode of the fourth transistor T4b is opposite to the case shown in FIG. 3.

The pixel PXijb shown in FIG. 10 includes the same N-type transistors, and thus the display device 10 can be easily manufactured.

Figure 11:
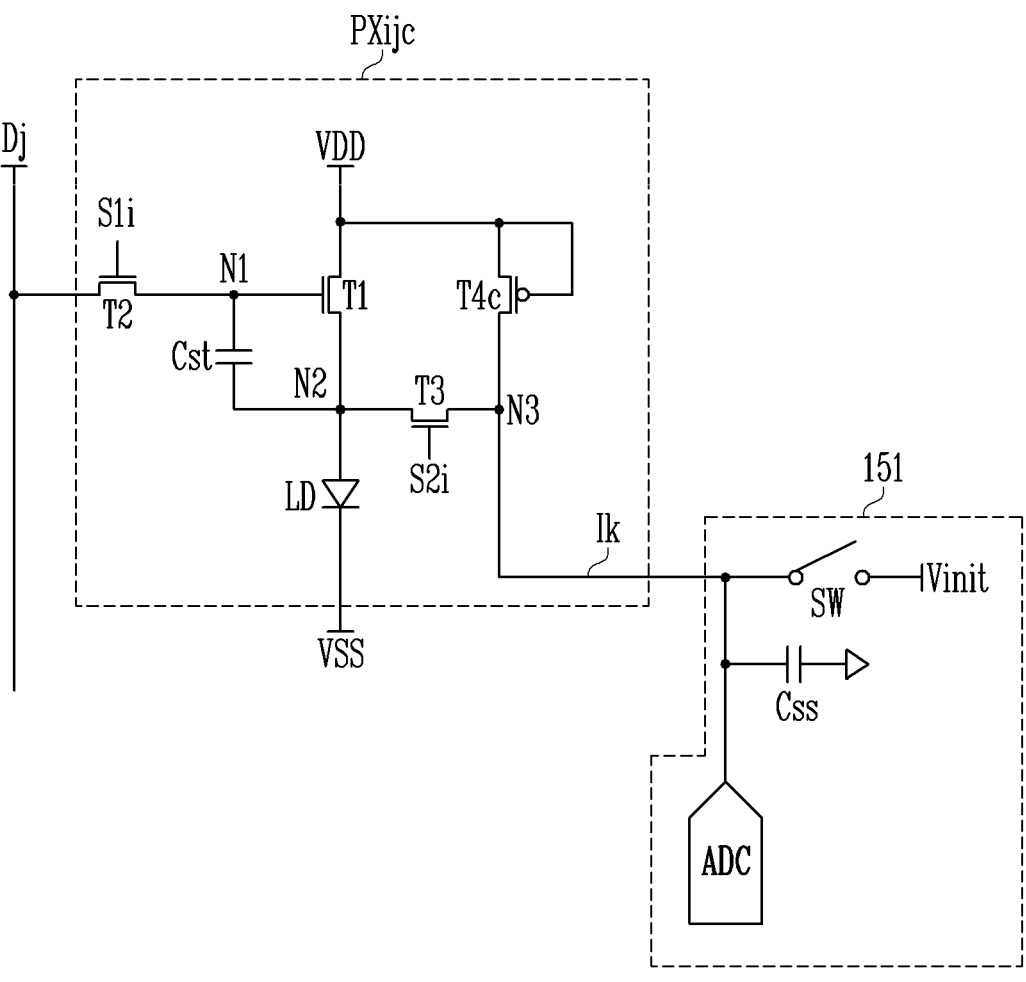
FIG. 11 is a diagram illustrating a pixel in accordance with still another embodiment of the present disclosure.

FIG. 11 is a diagram illustrating a pixel in accordance with still another embodiment of the present disclosure.

A fourth transistor T4*c* of the pixel PXijc shown in FIG. 11 is different from the fourth transistor T4*a* of the pixel PXija shown in FIG. 3, in that a gate electrode of the fourth transistor T4*c* is connected to a first electrode of the fourth transistor T4*c*.

The fourth transistor T4*c* shown in FIG. 11 performs the same function as a diode connected thereto in a reverse direction. Therefore, the fourth transistor T4*c* is always in the OFF state.

Since it is unnecessary for the pixel PXijc shown in FIG. 11 to be connected to the third scan line, the construction cost of the display device 10 can be reduced. Further, since the third scan line can be removed, the amount of dead space in the display device 10 can be reduced.

In the display device and the driving method thereof in accordance with the present disclosure, temperatures can be actually measured in pixel units.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising a pixel and a sensing channel connected to the pixel through a sensing line, wherein the pixel includes:

a first transistor including a gate electrode connected to a first node, a first electrode connected to a first power line, and a second electrode connected to a second node;

a second transistor including a gate electrode connected to a first scan line, a first electrode connected to a data line, and a second electrode connected to the first node;

a third transistor including a gate electrode connected to a second scan line, a first electrode connected to the second node, and a second electrode connected to a third node; and a fourth transistor including a first electrode connected to the first power line on a first electrode side of the first transistor and a second electrode directly connected to the third node, wherein the sensing line is directly connected to the third node.

2. The display device of claim 1, wherein an off-current of the fourth transistor changes at a greater rate than an off-current of the third transistor in response to temperature change.

3. The display device of claim 1, wherein the pixel includes:

a storage capacitor including a first electrode connected to the first node and a second electrode connected to the second node; and a light emitting element including an anode connected to the second node and a cathode connected to a second power line.

4. The display device of claim 1, wherein the first transistor, the second transistor, the third transistor, and the fourth transistor are N-type transistors.

5. The display device of claim 1, wherein a gate electrode of the fourth transistor is connected to the first electrode of the fourth transistor.

6. The display device of claim 1, wherein a gate electrode of the fourth transistor is connected to a third scan line.

7. The display device of claim 6, wherein the sensing channel includes:

an initialization voltage switchably supplied to the third node;

a sensing capacitor including a first electrode connected to the third node; and an analog-digital converter including an input terminal connected to the third node.

8. The display device of claim 7, wherein, during a first period, OFF-level scan signals are applied to the first scan line, the second scan line, and the third scan line, and the initialization voltage is supplied to the third node, and wherein, during a second period after the first period, OFF-level scan signals are applied to the first scan line, the second scan line, and the third scan line, the initialization voltage is disconnected from the third node, and the analog-digital converter outputs a digital value corresponding to a voltage of the third node.

9. The display device of claim 8, wherein a temperature of the pixel is determined based on a first voltage variation of the third node during the second period.

10. The display device of claim 9, wherein the degree of temperature change of the pixel correlates with magnitude of the first voltage variation of the third node during the second period.

11. The display device of claim 8 wherein, during a third period after the second period, OFF-level scan signals are applied to the first scan line, the second scan line, and the third scan line, and the initialization voltage is supplied to the third node, wherein, during a fourth period after the third period, ON-level scan signals are applied to the first scan line and the second scan line, an OFF-level scan signal is applied to the third scan line, and the initialization voltage is supplied to the third node, and wherein, during a fifth period after the fourth period, an ON-level scan signal is applied to the second scan line, OFF-level scan signals are applied to the first scan line and the third scan line, the initialization voltage is disconnected from the third node, and the analog-digital converter outputs a digital value corresponding to the voltage of the third node.

12. The display device of claim 11, wherein a reference current of the pixel is determined based on the first voltage variation of the third node during the second period and a second voltage variation of the third node during the fifth period.

13. The display device of claim 12, wherein the reference current becomes larger as a difference between the second voltage variation and the first voltage variation becomes larger.

14. The display device of claim 13, wherein a mobility of the pixel is determined based on the reference current.

15. The display device of claim 14, wherein the mobility becomes higher as the reference current becomes larger.

16. An electronic device comprising:

a processor configured to provide an image frame; and a display device configured to display an image based on the image frame, wherein the display device comprises a pixel and a sensing channel connected to the pixel through a sensing line, 5 wherein the pixel includes:

a first transistor including a gate electrode connected to a first node, a first electrode connected to a first power line, and a second electrode connected to a second node; 10 a second transistor including a gate electrode connected to a first scan line, a first electrode connected to a data line, and a second electrode connected to the first node; 15 a third transistor including a gate electrode connected to a second scan line, a first electrode connected to the second node, and a second electrode connected to a third node; and a fourth transistor including a first electrode connected to the first power line on a first electrode side of the first transistor and a second electrode directly connected to the third node, and 20 wherein the sensing line is directly connected to the third node. 25

* * * * *